United States Patent
Sun et al.

(10) Patent No.: US 10,861,673 B2
(45) Date of Patent: Dec. 8, 2020

(54) METHOD OF PATTERN DATA PREPARATION AND METHOD OF FORMING PATTERN IN LAYER

(71) Applicant: UNITED MICROELECTRONICS CORP., Hsin-Chu (TW)

(72) Inventors: Chien-Ying Sun, Tainan (TW); En-Chiuan Liou, Tainan (TW); Yu-Cheng Tung, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 184 days.

(21) Appl. No.: 16/143,419

(22) Filed: Sep. 26, 2018

(65) Prior Publication Data

US 2020/0083020 A1   Mar. 12, 2020

(30) Foreign Application Priority Data

Sep. 7, 2018   (TW) .............................. 107131481 A

(51) Int. Cl.
*H01J 37/302* (2006.01)
*H01J 37/317* (2006.01)
*H01L 21/027* (2006.01)

(52) U.S. Cl.
CPC ...... *H01J 37/3026* (2013.01); *H01J 37/3174* (2013.01); *H01J 2237/30433* (2013.01); *H01J 2237/31769* (2013.01); *H01J 2237/31776* (2013.01); *H01L 21/0277* (2013.01)

(58) Field of Classification Search
CPC ............... H01J 37/3026; H01J 37/3174; H01J 2237/31776; H01J 2237/30433; H01J 2237/31769; H01L 21/0277
See application file for complete search history.

(56) References Cited

U.S. PATENT DOCUMENTS

| | | | |
|---|---|---|---|
| 5,434,424 A * | 7/1995 | Stickel | B82Y 10/00 250/492.23 |
| 6,014,200 A | 1/2000 | Sogard | |
| 6,271,852 B1 * | 8/2001 | Kamiyama | H01J 37/3026 250/492.22 |
| 7,901,850 B2 | 3/2011 | Fujimura | |
| 2013/0010100 A1 * | 1/2013 | Kotaki | G01B 15/04 348/80 |
| 2015/0332452 A1 * | 11/2015 | Tsuchiya | G06T 7/0008 382/147 |
| 2016/0124323 A1 * | 5/2016 | Chung | G03F 7/70158 438/7 |
| 2016/0211118 A1 * | 7/2016 | Yashima | H01J 37/3026 |
| 2016/0349626 A1 * | 12/2016 | Matsumoto | H01J 37/3174 |

* cited by examiner

*Primary Examiner* — Brooke Purinton
(74) *Attorney, Agent, or Firm* — Winston Hsu

(57) ABSTRACT

A method of pattern data preparation includes the following steps. A desired pattern to be formed on a surface of a layer is inputted. A first set of beam shots are determined, and a first calculated pattern on the surface is calculated from the first set of beam shots. The first calculated pattern is rotated, so that a boundary of the desired pattern corresponding to a non-smooth boundary of the first calculated pattern is parallel to a boundary constituted by beam shots. A second set of beam shots are determined to revise the non-smooth boundary of the first calculated pattern, thereby calculating a second calculated pattern being close to the desired pattern on the surface. The present invention also provides a method of forming a pattern in a layer.

20 Claims, 4 Drawing Sheets

METHOD OF PATTERN DATA PREPARATION AND METHOD OF FORMING PATTERN IN LAYER

BACKGROUND OF THE INVENTION

1. Field of the Invention

The present invention relates generally to a method of pattern data preparation and a method of forming a pattern in a layer, and more specifically to a method of pattern data preparation and a method of forming a pattern in a layer for revising pattern boundaries.

2. Description of the Prior Art

An electron beam (E-beam) writing process is a process to transform a medium using an electron beam. In particular, some electron beam writing processes use electron beams to write a design (pattern) in a medium. The media may be a semiconductor wafer or a mask (e.g., fused silica and chrome masks) etc. Therefore, the E-beam writing process provides a method of forming features on a medium, wherein such features can be smaller than physical limits of lights.

In detail, the E-beam writing process is to form a pattern on a medium by using beam shots. However, due to the shapes and sizes of the beam shots, the pattern may not be formed by the beam shots perfectly. For example, while a right triangle pattern is to be formed, the two legs of the right triangle pattern can be formed by aligning rectangle beam shots, but the hypotenuse of the right triangle pattern is difficult to be composed of rectangle beam shots. Only a stepped-hypotenuse composed of several squares can be formed by emitting the rectangle beam shots. Besides, a large amount of data is needed for aligning and emitting these rectangle beam shots, thus increasing the complexity of processes and reducing process efficiency.

SUMMARY OF THE INVENTION

The present invention relates generally to a method of pattern data preparation and a method of forming a pattern in a layer, which rotates a pattern to make a boundary of the pattern parallel to a boundary constituted by beam shots, thereby simplifying data of revising the pattern and improving pattern revising processes.

The present invention provides a method of pattern data preparation including the following steps. A desired pattern to be formed on a surface of a layer is inputted. A first set of beam shots is determined, and a first calculated pattern on the surface is calculated from the first set of beam shots. The first calculated pattern is rotated, so that a boundary of the desired pattern corresponding to a non-smooth boundary of the first calculated pattern is parallel to a boundary constituted by beam shots. A second set of beam shots is determined to revise the non-smooth boundary of the first calculated pattern, thereby calculating a second calculated pattern being close to the desired pattern on the surface.

The present invention provides a method of forming a pattern in a layer including the following steps. A first pattern is printed on a surface of a layer, wherein the first pattern is printed by emitting a first set of beam shots. The first pattern is rotated, so that a boundary of a desired pattern corresponding to a non-smooth boundary of the first pattern is parallel to a boundary constituted by beam shots. The non-smooth boundary of the first pattern is revised by emitting a second set of beam shots, thereby printing a second pattern being close to the desired pattern on the surface.

According to the above, the present invention provides a method of pattern data preparation and a method of forming a pattern in a layer, which rotates a first calculated pattern to make a boundary of a desired pattern corresponding to the first calculated pattern parallel to a boundary constituted by beam shots. Therefore, a second set of beam shots used for revising a non-smooth boundary of the first calculated pattern being determined. Otherwise, a first pattern is rotated to make a boundary of a desired pattern corresponding to the first pattern parallel to a boundary constituted by beam shots. Therefore, a second set of beam shots used for revising a non-smooth boundary of the first pattern is determined. In this way, the methods of the present invention can simplify current processes such as revising a boundary by correcting several points individually utilizing optical proximity correction methods, hence improving pattern revising processes.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
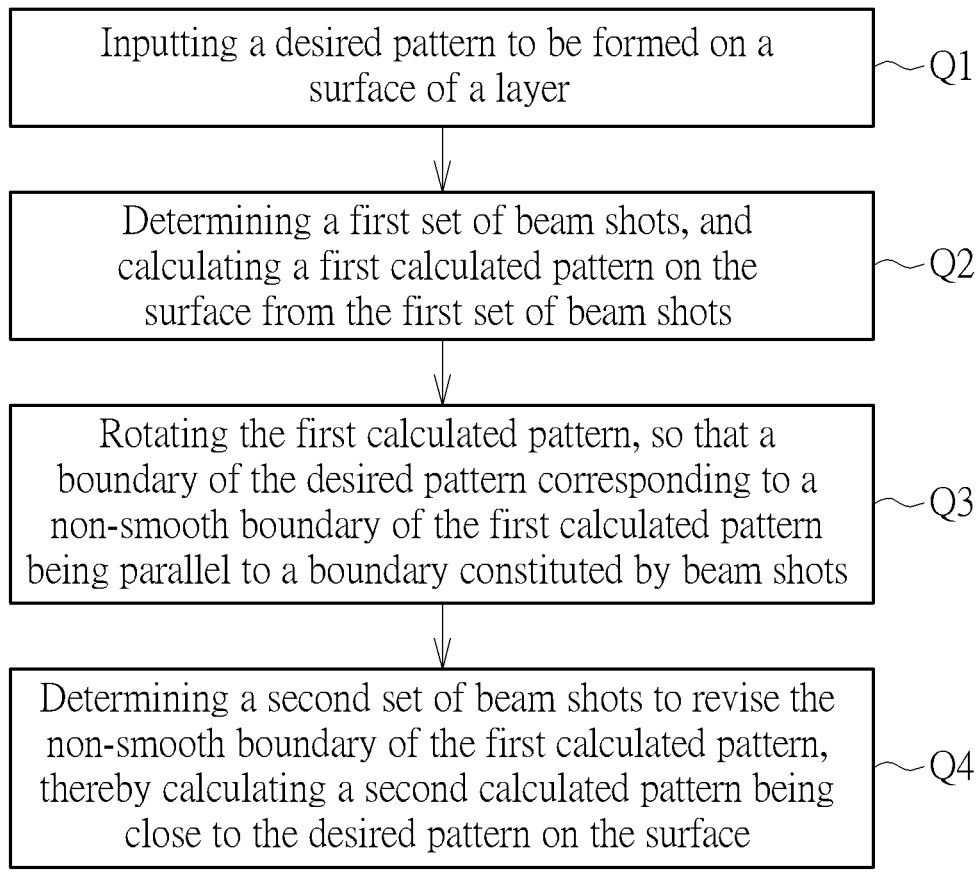
FIG. 1 schematically depicts a flowchart of a method of pattern data preparation according to an embodiment of the present invention.
Figure 2:
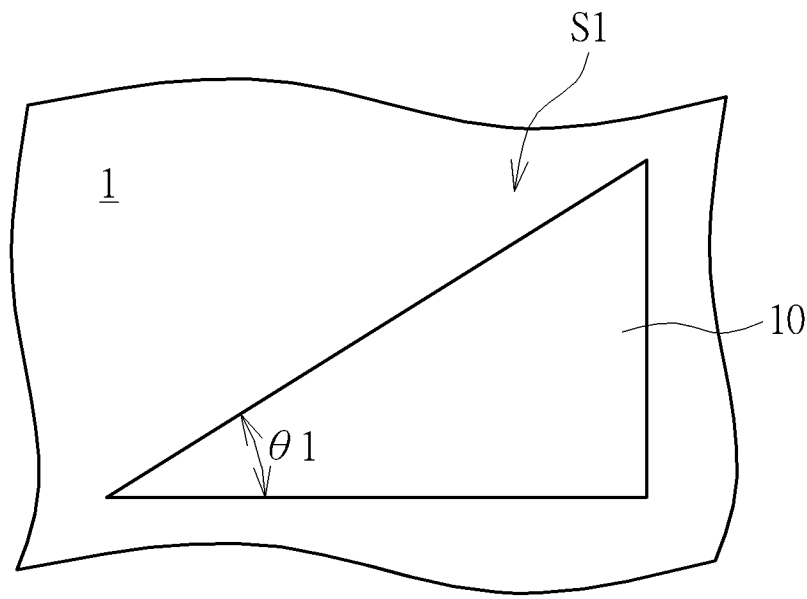
FIG. 2 schematically depicts a top view of a desired pattern according to an embodiment of the present invention.
Figure 3:
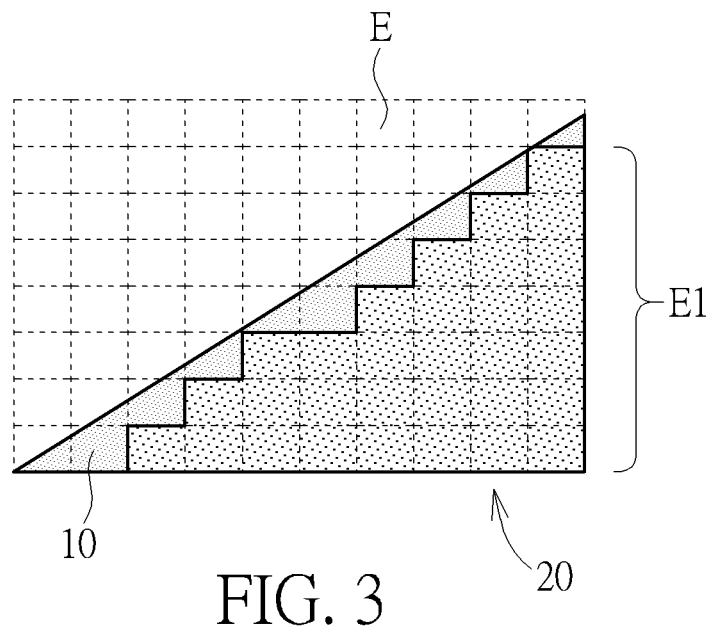
FIG. 3 schematically depicts a top view of relative positions of a first calculated pattern, a desired pattern and a first set of beam shots according to an embodiment of the present invention.
Figure 4:
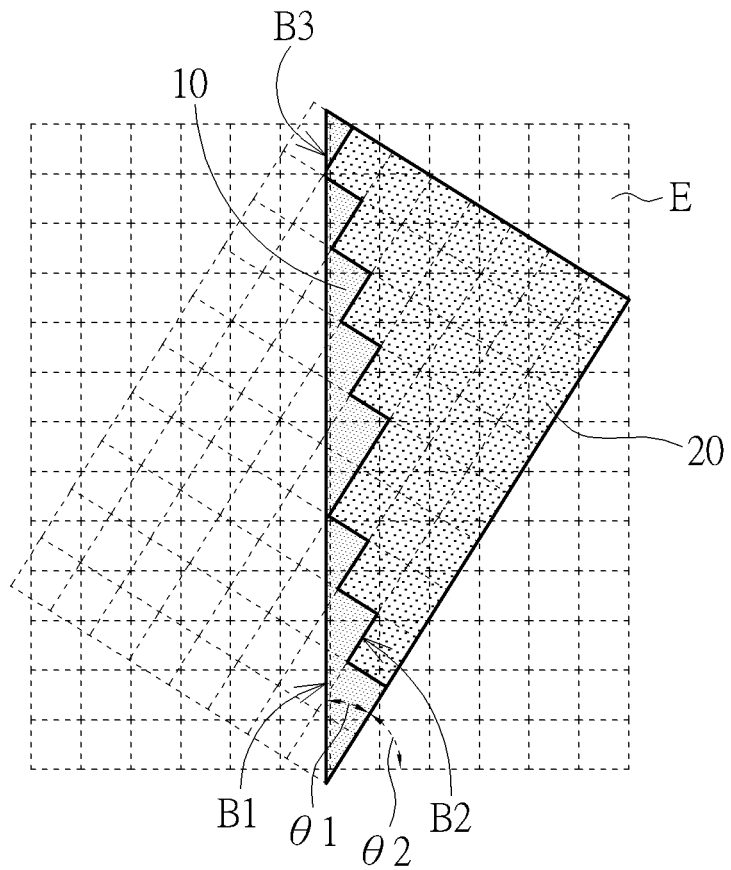
FIG. 4 schematically depicts a top view of relative positions of a rotated first calculated pattern and a rotated desired pattern according to an embodiment of the present invention.
Figure 5:
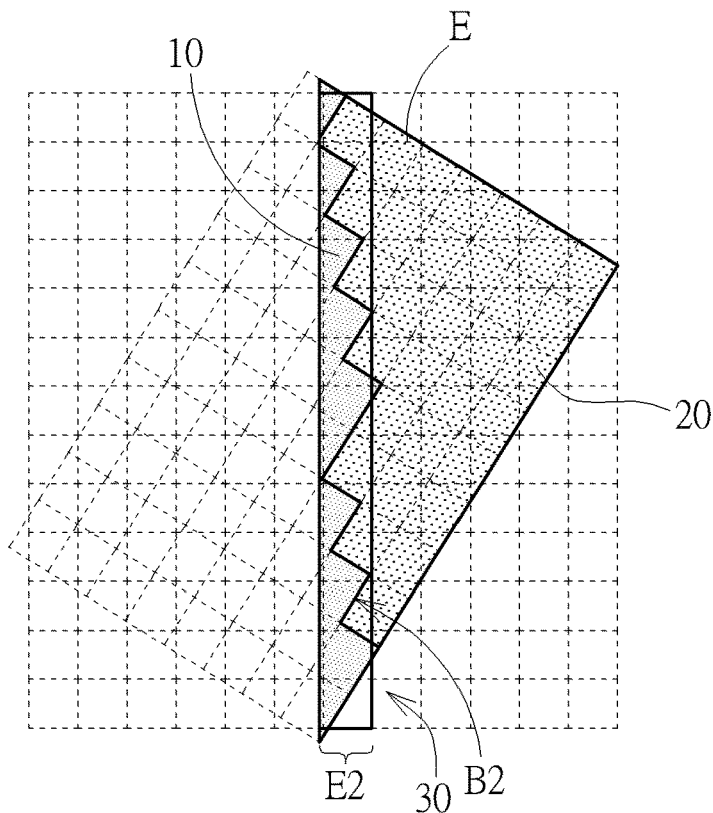
FIG. 5 schematically depicts a top view of relative positions of a rotated first calculated pattern, a rotated desired pattern and a second set of beam shots according to an embodiment of the present invention.

FIG. 1 schematically depicts a flowchart of a method of pattern data preparation according to an embodiment of the present invention. FIG. 2 schematically depicts a top view of a desired pattern according to an embodiment of the present invention. FIG. 3 schematically depicts a top view of relative positions of a first calculated pattern, a desired pattern and a first set of beam shots according to an embodiment of the present invention. FIG. 4 schematically depicts a top view of relative positions of a rotated first calculated pattern and a rotated desired pattern according to an embodiment of the present invention. FIG. 5 schematically depicts a top view of relative positions of a rotated first calculated pattern, a rotated desired pattern and a second set of beam shots according to an embodiment of the present invention.

According to a step Q1 of FIG. 1: inputting a desired pattern to be formed on a surface of a layer, this is shown in FIGS. 1-2. A desired pattern 10 is inputted. The desired pattern 10 is formed on a surface S1 of a layer 1. In this embodiment, the desired pattern 10 is a triangle pattern having an angle θ1, but it is not limited thereto. In one case, the desired pattern 10 is a right triangle pattern. The desired pattern 10 may be formed on a surface of a coated mask layer or a surface of a wafer, depending upon practical requirements.

According to a step Q2 of FIG. 1: determining a first set of beam shots, and calculating a first calculated pattern on the surface from the first set of beam shots, this is shown in FIG. 1 and FIG. 3. Each square of FIG. 3 represents a beam shot E. In this embodiment, the beam shots E are rectangle beam shots, but it is not limited thereto. In another embodiment, the beam shots may be circular beam shots, or beam shots with variable shapes. A first set of beam shots E1 is determined in the step Q2, and the first set of beam shots E1 include the maximum number of the rectangle beam shots E constituting the desired pattern 10. A first calculated pattern 20 can be formed on a surface of a coated mask layer or a surface of a wafer from the first set of beam shots E1.

According to a step Q3 of FIG. 1: rotating the first calculated pattern, so that a boundary of the desired pattern corresponding to a non-smooth boundary of the first calculated pattern being parallel to a boundary constituted by beam shots, FIG. 1 and FIG. 4 are depicted. A boundary B1 of the desired pattern 10 corresponds to a non-smooth boundary B2 of the first calculated pattern 20. Then, the first calculated pattern 20 (and the corresponding desired pattern 10) is rotated, to make the boundary B1 of the desired pattern 10 parallel to a boundary B3 constituted by the beam shots E. In this embodiment, as the boundary B1 of the desired pattern 10 is parallel to a vertical boundary constituted by the beam shots E(, meaning the boundary B3 is the vertical boundary), and the pattern 10 has the angle θ1, an angle θ2 of rotating the first calculated pattern 20 is the deviation of 90° and the angle θ1. In another case, the first calculated pattern 20 (and the corresponding desired pattern 10) may be rotated, to make the boundary B1 of the desired pattern 10 parallel to a horizontal boundary constituted by the beam shots E, depending upon practical requirements.

According to a step Q4 of FIG. 1: determining a second set of beam shots to revise the non-smooth boundary of the first calculated pattern, thereby calculating a second calculated pattern being close to the desired pattern on the surface, FIG. 1 and FIG. 5 are depicted. A second set of beam shots E2 is determined to revise the non-smooth boundary B2 of the first calculated pattern 20. In this embodiment, the second set of beam shots E2 are a plurality of beam shots constituting a rectangular pattern, to revise the non-smooth boundary B2 of the first calculated pattern 20. Thereby, a second calculated pattern 30 (meaning the first calculated pattern 20 revised by the rectangular pattern) is calculated, and the second calculated pattern 30 being formed in a surface of a coated mask layer or a surface of a wafer approaches the desired pattern 10. Thereafter, the second calculated pattern 30 is outputted to form a mask pattern. By applying the revising method of the present invention, the boundary of the first calculated pattern can be revised by the boundary constituted by beam shots only through rotating the first calculated pattern. Thus, current revising methods such as revising a boundary by correcting several points individually utilizing optical proximity correction methods can be simplified. This reduces pattern data and improves pattern revising processes.

In this case, the step Q3 of FIG. 1: rotating the first calculated pattern, so that a boundary of the desired pattern corresponding to a non-smooth boundary of the first calculated pattern being parallel to a boundary constituted by beam shots and the step Q4 of FIG. 1: determining a second set of beam shots to revise the non-smooth boundary of the first calculated pattern, thereby calculating a second calculated pattern being close to the desired pattern on the surface are performed only once to revise the non-smooth boundary B2 of the first calculated pattern 20 once. In another embodiment, the step Q3 of FIG. 1: rotating the first calculated pattern, so that a boundary of the desired pattern corresponding to a non-smooth boundary of the first calculated pattern being parallel to a boundary constituted by beam shots and the step Q4 of FIG. 1: determining a second set of beam shots to revise the non-smooth boundary of the first calculated pattern, thereby calculating a second calculated pattern being close to the desired pattern on the surface may be performed repeatedly, so that the single non-smooth boundary B2 of the first calculated pattern 20 can be revised several times, or a plurality of boundaries of the first calculated pattern 20 may be revised.

Figure 6:
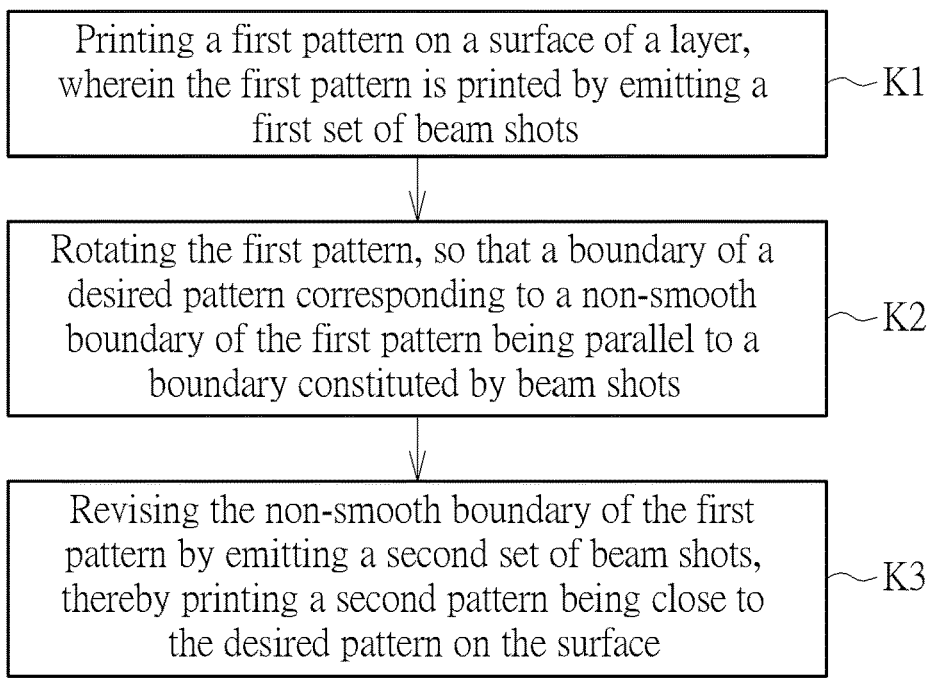
FIG. 6 schematically depicts a flowchart of a method of forming a pattern in a layer according to an embodiment of the present invention.
Figure 7:
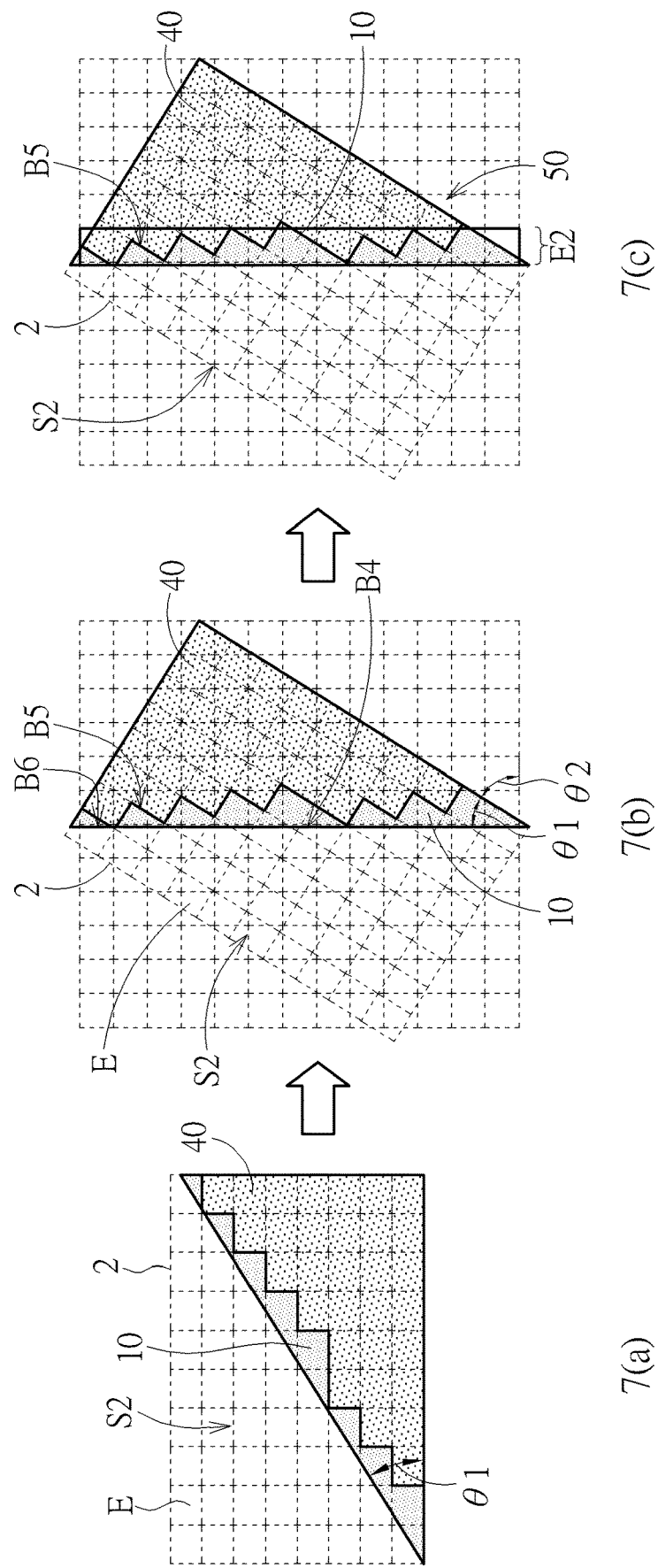
FIG. 7 schematically depicts a top view of a method of forming a pattern in a layer according to an embodiment of the present invention.

Above all, a method of pattern data preparation is provided to prepare pattern data in a computer system, and then these patterns can be formed in a surface of a coated mask layer or a surface of a wafer. A method of forming a pattern in a layer is presented in the following. FIG. 6 schematically depicts a flow chart of a method of forming a pattern in a layer according to an embodiment of the present invention. FIG. 7 schematically depicts a top view of a method of forming a pattern in a layer according to an embodiment of the present invention.

According to a step K1 of FIG. 6: printing a first pattern on a surface of a layer, wherein the first pattern is printed by emitting a first set of beam shots, FIGS. 6-7 are depicted. As shown in FIG. 7 (a), a first pattern 40 is formed on a surface S2 of a layer 2. In this embodiment, the beam shots E are rectangle beam shots, and thus squares depicted in FIG. 7 are beam shots can be emitted on the surface S2 of the layer 2, wherein the beam shots E are E-beam writing beam shots, but it is not limited thereto. For illustrating the present invention clearly, the desired pattern 10 in FIG. 7 is depicted for comparing to the first pattern 40, but is not actually formed on the surface S2 of the layer 2. In this embodiment, the desired pattern 10 is a triangle pattern having an angle θ1, but it is not limited thereto. In one case, the desired pattern 10 is a right triangle pattern. The surface S2 of the layer 2 may be a surface of a mask layer or a surface of a wafer, depending upon practical requirements. The first pattern 40 may include the maximum number of the rectangle beam shots E constituting the desired pattern 10.

According to a step K2 of FIG. 6: rotating the first pattern, so that a boundary of a desired pattern corresponding to a non-smooth boundary of the first pattern being parallel to a boundary constituted by beam shots, FIGS. 6-7 are depicted. As shown in FIG. 7 (b), a boundary B4 of the desired pattern 10 corresponds to a non-smooth boundary B5 of the first pattern 40. Then, the first pattern 40 is rotated to make the boundary B4 of the desired pattern 10 parallel to a boundary B6 constituted by the beam shots E. In this embodiment, a method of rotating the first pattern 40 is rotating the surface S2 of the layer 2. In another embodiment, the method of rotating the first pattern 40 may include rotating a reticle stage loading the layer 2 and then aligning the layer 2, depending upon practical requirements. In this case, as the boundary B4 of the desired pattern 10 is parallel to a vertical boundary constituted by the beam shots E(, meaning the boundary B6 is the vertical boundary), and the first pattern 40 has the angle θ1, an angle θ2 of rotating the first pattern 40 is the deviation of 90° and the angle θ1. In another case, the boundary B4 of the desired pattern 10 may be parallel to a horizontal boundary constituted by the beam shots E, depending upon practical requirements.

According to a step K3 of FIG. 6: revising the non-smooth boundary of the first pattern by emitting a second set of beam shots, thereby printing a second pattern being close to the desired pattern on the surface, FIGS. 6-7 are depicted. As shown in FIG. 7(c), a second set of beam shots E2 is emitted to revise the non-smooth boundary B5 of the first pattern 40, thereby a second pattern 50 being formed on the surface S2, wherein the second pattern 50 approaches the desired pattern 10 on the surface S2. In this case, the second set of beam shots E2 is a rectangular pattern, and the second pattern 50 is the first pattern 40 revised by the rectangular pattern. In this embodiment, the second pattern 50 is formed on a surface of a mask layer or a surface of a wafer. In one case, the second pattern 50 printed on a surface of a mask layer is then printed on a surface of a wafer. By applying the revising method of the present invention, the boundary of the first pattern can be revised by the boundary constituted by beam shots only through rotating the first pattern. Thus, current revising methods such as revising a boundary by correcting several points individually utilizing optical proximity correction methods can be simplified. This simplifies processes and improves pattern revising processes.

In this case, the step K2 of FIG. 6: rotating the first pattern, so that a boundary of a desired pattern corresponding to a non-smooth boundary of the first pattern being parallel to a boundary constituted by beam shots and the step K3 of FIG. 6: revising the non-smooth boundary of the first pattern by emitting a second set of beam shots, thereby printing a second pattern being close to the desired pattern on the surface are performed only once to form a second pattern on a surface, wherein the second pattern approaches a desired pattern on the surface. Thus, the non-smooth boundary B5 of the first pattern 40 is revised once. In another embodiment, the step K2 of FIG. 6: rotating the first pattern, so that a boundary of a desired pattern corresponding to a non-smooth boundary of the first pattern being parallel to a boundary constituted by beam shots and the step K3 of FIG. 6: revising the non-smooth boundary of the first pattern by emitting a second set of beam shots, thereby printing a second pattern being close to the desired pattern on the surface may be performed repeatedly, to form a second pattern on a surface, wherein the second pattern approaches a desired pattern on a surface. Thus, the single non-smooth boundary B5 of the first pattern 40 can be revised several times, or a plurality of boundaries of the first pattern 40 may be revised.

To summarize, the present invention relates generally to a method of pattern data preparation, which inputs a desired pattern to be formed on a surface of a layer; determines a first set of beam shots, and calculates a first calculated pattern on the surface from the first set of beam shots; rotates the first calculated pattern to make a boundary of a desired pattern corresponding to a non-smooth boundary of the first calculated pattern being parallel to a boundary constituted by beam shots; determines a second set of beam shots to revise the non-smooth boundary of the first calculated pattern, thereby calculating a second calculated pattern being close to the desired pattern on the surface. Thereafter, a method of forming a pattern in a layer of the present invention can be performed, which prints a first pattern on a surface of a layer, wherein the first pattern is printed by emitting a first set of beam shots; rotates the first pattern, so that a boundary of a desired pattern corresponding to a non-smooth boundary of the first pattern being parallel to a boundary constituted by beam shots; revises the non-smooth boundary of the first pattern by emitting a second set of beam shots, thereby printing a second pattern being close to the desired pattern on the surface. By doing this, the boundary of the desired pattern corresponding to the non-smooth boundary of the first calculated pattern can be parallel to the boundary constituted by beam shots through rotating the first calculated pattern, so that the second set of beam shots used for revising the non-smooth boundary of the first calculated pattern can be determined. Otherwise, a first pattern is rotated to make a boundary of a desired pattern corresponding to the first pattern parallel to a boundary constituted by beam shots. Therefore, a second set of beam shots used for revising a non-smooth boundary of the first pattern being determined. As a result, the methods of the present invention can simplify current processes such as revising a boundary by correcting several points individually utilizing optical proximity correction methods, hence improving pattern revising processes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of pattern data preparation, comprising:
   inputting a desired pattern to be formed on a surface of a layer by an electron beam (E-beam) writing machine;
   determining a first set of beam shots, and calculating a first calculated pattern on the surface from the first set of beam shots;
   rotating the first calculated pattern, so that a boundary of the desired pattern, which corresponds to a non-smooth boundary of the first calculated pattern, is parallel to a boundary constituted by beam shots; and
   determining a second set of beam shots to revise the non-smooth boundary of the first calculated pattern, thereby calculating a second calculated pattern approaching the desired pattern on the surface.

2. The method of pattern data preparation according to claim 1, wherein the desired pattern comprises a triangle pattern having an angle.

3. The method of pattern data preparation according to claim 2, wherein an angle θ2 of rotating the first calculated pattern is the difference of 90° and an angle θ1 of the first calculated pattern.

4. The method of pattern data preparation according to claim 1, wherein the beam shots are rectangle beam shots.

5. The method of pattern data preparation according to claim 4, wherein the first calculated pattern comprises the maximum number of the rectangle beam shots constituting the desired pattern.

6. The method of pattern data preparation according to claim 1, further comprising:
   outputting the second calculated pattern to form a mask pattern.

7. The method of pattern data preparation according to claim 1, wherein the steps of rotating the first calculated pattern and determining the second set of beam shots to revise the non-smooth boundary of the first calculated pattern are processed repeatedly.

8. The method of pattern data preparation according to claim 7, wherein the steps of rotating the first calculated pattern and determining the second set of beam shots to revise the non-smooth boundary of the first calculated pattern are processed repeatedly to revise boundaries of the first calculated pattern.

9. A method of forming a pattern in a layer, comprising:
printing a first pattern on a surface of a layer, wherein the first pattern is printed by emitting a first set of beam shots;
rotating the first pattern, so that a boundary of a desired pattern, which corresponds to a non-smooth boundary of the first pattern, is parallel to a boundary constituted by beam shots; and
revising the non-smooth boundary of the first pattern to a smooth boundary by emitting a second set of beam shots, thereby printing a second pattern approaching the desired pattern on the surface.

10. The method of forming a pattern in a layer according to claim 9, wherein the method of rotating the first pattern comprises rotating the surface of the layer.

11. The method of forming a pattern in a layer according to claim 9, wherein the method of rotating the first pattern comprises rotating a reticle stage loading the layer and aligning the layer.

12. The method of forming a pattern in a layer according to claim 9, wherein the desired pattern comprises a triangle pattern having an angle.

13. The method of forming a pattern in a layer according to claim 12, wherein an angle $\theta 2$ of rotating the first pattern is the difference of 90° and an angle $\theta 1$ of the first pattern.

14. The method of forming a pattern in a layer according to claim 9, wherein the beam shots are rectangle beam shots.

15. The method of forming a pattern in a layer according to claim 14, wherein the first pattern comprises the maximum number of the rectangle beam shots constituting the desired pattern.

16. The method of forming a pattern in a layer according to claim 9, wherein the surface of the layer comprises a surface of a mask or a surface of a wafer.

17. The method of forming a pattern in a layer according to claim 16, wherein the second pattern printed on the surface of the mask is then printed on a surface of a wafer.

18. The method of forming a pattern in a layer according to claim 9, wherein the beam shots are beam shots of E-beam writing.

19. The method of forming a pattern in a layer according to claim 9, wherein the steps of rotating the first pattern and revising the non-smooth boundary of the first pattern are processed repeatedly.

20. The method of forming a pattern in a layer according to claim 19, wherein the steps of rotating the first pattern and revising the non-smooth boundary of the first pattern are processed repeatedly to revise boundaries of the first pattern.

* * * * *